United States Patent
Sachse et al.

(10) Patent No.: US 11,536,587 B2
(45) Date of Patent: Dec. 27, 2022

(54) DIGITAL PHASE TRACKING FILTER FOR POSITION SENSING

(71) Applicant: Melexis Technologies SA, Bevaix (CH)

(72) Inventors: Eric Sachse, Dresden (DE); Gael Close, Bevaix (CH)

(73) Assignee: MELEXIS TECHNOLOGIES SA, Bevaix (CH)

( * ) Notice: Subject to any disclaimer, the term of this patent is extended or adjusted under 35 U.S.C. 154(b) by 19 days.

(21) Appl. No.: 17/213,613

(22) Filed: Mar. 26, 2021

(65) Prior Publication Data

US 2021/0302200 A1 Sep. 30, 2021

(30) Foreign Application Priority Data

Mar. 28, 2020 (EP) .................................. 20166531

(51) Int. Cl.
| | |
|---|---|
| *G01D 5/14* | (2006.01) |
| *G01D 5/24* | (2006.01) |
| *G01P 3/48* | (2006.01) |
| *G01D 5/244* | (2006.01) |
| *G01P 3/481* | (2006.01) |

(Continued)

(52) U.S. Cl.
CPC ........... *G01D 5/145* (2013.01); *G01D 5/2448* (2013.01); *G01D 5/24466* (2013.01); *G01D 5/24476* (2013.01); *G01P 3/481* (2013.01); *G01R 33/0041* (2013.01); *G01R 33/075* (2013.01); *G01R 33/077* (2013.01); *H03L 7/0805* (2013.01)

(58) Field of Classification Search
CPC .. G01D 5/145; G01D 5/24466; G01D 5/2448; G01P 3/481

See application file for complete search history.

(56) References Cited

U.S. PATENT DOCUMENTS

| | | | |
|---|---|---|---|
| 10,120,042 B2 * | 11/2018 | Diaconu | G01R 33/077 |
| 2009/0190283 A1 | 7/2009 | Hammerschmidt et al. | |

(Continued)

FOREIGN PATENT DOCUMENTS

| | | |
|---|---|---|
| EP | 1980821 A2 | 10/2008 |
| EP | 2975364 A1 | 1/2016 |
| EP | 3517897 A1 | 7/2019 |

OTHER PUBLICATIONS

Extended Search Report from corresponding European Application No. 20166531.2, dated Sep. 3, 2020.

*Primary Examiner* — Reena Aurora
(74) *Attorney, Agent, or Firm* — Workman Nydegger

(57) ABSTRACT

A position sensor device includes position sensor elements for generating analog sense signals. A digitization circuit is provided for a digital signal representative of the input phase based on the analog sense signals and a digital processing unit. An output signal is indicative of the position based on the first output of the processing unit. The processing unit comprises an error signal generator for computing an error signal indicative of a phase difference between the digital signal and a feedback signal. A digital filter filters the error signal to generate the first output. A feedback path provides the feedback signal based on the first output and a filter selector to select a filter to be applied from different filters. At least one input on which a common filter circuit operates is scaled differently for each of the different filters to select different filter bandwidths.

15 Claims, 7 Drawing Sheets

(51) Int. Cl.
  *G01R 33/00* (2006.01)
  *G01R 33/07* (2006.01)
  *H03L 7/08* (2006.01)

(56) References Cited

U.S. PATENT DOCUMENTS

2016/0363638 A1    12/2016  Daubert
2019/0226880 A1*   7/2019   Raman ................. G01D 18/004
2020/0271479 A1*   8/2020   Wang .................... G01D 5/145

* cited by examiner

DIGITAL PHASE TRACKING FILTER FOR POSITION SENSING

TECHNICAL FIELD

The present invention relates to the field of position sensors, and, more specifically, the invention relates to the digital processing of signals of a position sensor by applying a phase tracking approach. Particularly, the invention relates to a device and method for measuring a position using such digital processing.

TECHNICAL BACKGROUND

It is known in the art that a position, such as an angular position or a linear displacement, can be determined from a signal provided by a position sensor. For example, by mechanically associating the position to be determined with a relative orientation of a magnetic field generated by a magnetic component, e.g. a permanent magnet, and a magnetic field sensor, e.g. comprising Hall effect and/or inductive elements, the position can be deduced from the magnetic field property or properties sensed by the magnetic field sensor. In other words, such device may aim to determine an angular position (e.g. relative to a zero reference angle). Such angular position can obviously also be deterministically related to a more generic position to be determined, even a linear position, by a suitable mechanical coupling. The angular position affects a magnetic field sensed by one or more magnetic sensor elements, from which the position can thus be determined. The sensor signal(s) may behave substantially as a (co)sine signal, from which the angular position can be determined. Two of such signals, e.g. having a 90° phase offset with respect to each other (without limitation), is generally sufficient to determine the angular position in the range of a full rotation, but it may be advantageous to include additional sensor elements, e.g. three or more, for example three providing signals at relative 120° phase offsets. However, due to analog to digital conversion and other processing effects, as well as sensor noise, the accuracy and speed at which the angular position can be determined has its limitations. For example, filtering techniques are commonly used in such position sensor devices, e.g. to obtain an angular position estimate that is less noisy, more smooth and/or more robust against various disturbances.

For example, US2016/363638 discloses a magnetic field sensor for angle detection of a sensed magnetic field. This sensor comprises a phase-locked loop that receives a magnetic field signal, selected by sequence and current spinning switches, from a plurality of magnetic field sensing elements. The magnetic field signal has a phase indicative of the angle of the magnetic field. The phase-locked loop generates an angle signal proportional to the angle of the sensed magnetic field from this magnetic field signal. In the phase-locked loop, an oscillator generates a feedback signal to minimize a difference signal obtained by comparing the phase of the measured magnetic field signal and the phase of the feedback signal. The sensing elements are scanned sequentially, i.e. by a clock signal and associated logic to control the sequence and current spinning switches, such that during each readout time slot, only a single sensing element is being read out.

EP3517897 discloses another position sensing device, in which a plurality of sensors produce sensor signals, each signal being a function of an input phase representative of a position to be measured. A combiner circuit generates an error signal by combining the sensor signals according to an array of weight factors, e.g. applying a gain factor for each sensor signal. A processing block filters the error signal, e.g. for offset and noise suppression, and generates an output phase value representative of the position from the filtered error signal. A feedback loop adjusts the array of weight factors as a function of the output phase value, such that the combiner circuit can continue to estimate the error signal indicative of the position to be measured relatively to the estimated output phase value. Thus, a tracking loop is provided that keeps track of the position of interest incrementally, which advantageously can have a low readout latency and can provide a good accuracy even when changing at a high angular velocity. Since the combiner operates parallelly on all of the sensor signals, a good signal-to-noise behavior can be achieved by averaging out noise over the plurality of sensor elements.

In another example, EP2975364 discloses a signal evaluation circuit (comprised in an analog front-end) in a position sensing device that is coupled on its input side to at least two Hall elements and is designed to provide a digital position signal. The position sensor device comprises a loop filter (in a digital back-end) that receives an input from the signal evaluation unit. This loop filter comprises a subtractor receiving as one input the digital position signal of the signal evaluation unit. An integrator and a proportional element are connected in parallel between the output of the subtractor and the inputs of an adder. A position integrator numerically integrates the output of the adder. A delay unit couples the signal output of the position integrator back to the second input of the subtractor. The processing unit is designed to adaptively control a time constant of the integrator and/or of the position integrator.

SUMMARY

It is an object of embodiments of the present invention to provide devices and/or methods to process sensor signals, provided by a position sensing device, in the digital domain in a fast, efficient, cost-effective, reliable, reproducible, precise and/or accurate manner.

For example, it is an advantage of embodiments of the present invention that processing of the signal(s) in the analog domain can be reduced or avoided, yet a reliable, accurate and/or precise result value representative of the position (and/or related quantities, such as phase, velocity and/or acceleration) to be determined can still be obtained.

It is an advantage of embodiments of the present invention that by digitally processing the sensor signals, undesirable influences of exogenous factors on analog processing techniques can be avoided (or easily compensated), such as temperature or process dependencies.

It is an advantage of embodiments of the present invention that a filtered position signal is provided that is accurate, even over a wide range of angular velocities and/or accelerations.

It is a further advantage of embodiments of the present invention that a good signal-to-noise ratio can be obtained.

It is an advantage of embodiments of the present invention that estimates of angular position (or phase), angular velocity and angular acceleration can be determined in an efficient and/or fast manner.

It is an advantage that a speed and/or acceleration estimate can be easily obtained alongside a position (phase) estimate without a substantial additional computational or other processing resource cost, e.g. that speed and/or acceleration can be obtained as side-information. For example, this side-information may be advantageously used for delay compensation, e.g. for phase-drift compensation, in an additional stage, e.g. a processing delay may be compensated by compensating the corresponding phase drift that occurs during the processing delay. For example, this side-information may be used to tune the operation of the loop filter, e.g. to select a mode that is well-adjusted to a specific dynamic condition.

It is an advantage that a loop filter can be automatically adjusted to different dynamic conditions, for example to obtain optimal (or at least good) position estimates, e.g. which settle quickly to a good estimate under any of the different dynamic conditions. The different dynamic conditions can, for example, be caused by different accelerations and/or discontinuous sensor readout, e.g. to preserve power in an intermittent operation and/or in a start-up phase. Such automatic adjustment to different dynamic conditions may be referred to as (automatic) gear-shifting in the present disclosure.

It is an advantage of embodiments of the present invention that the need for post-processing, e.g. additional filter stages, can be reduced or avoided.

It is an advantage of embodiments of the present invention that a zero-delay filtering stage can be avoided.

It is an advantage of embodiments of the present invention that estimates of the quantity (quantities) of interest quickly settle to the quantity being estimated, i.e. a fast, efficient and/or accurate estimation process is provided.

It is a further advantage of embodiments of the present invention that automatic, e.g. inherent, gear-shifting is obtained. For example, different 'gears', e.g. loop filter modes, can be automatically selected by advantageously simple digital switching and comparisons, e.g. threshold value selectors. In other words, it may be an advantage that no intricate control logic may be required.

It is an advantage of embodiments of the present invention that good noise suppression is obtained.

It is an advantage of embodiments of the present invention that phase domain computation may be used in the forward filter path, e.g. offering unlimited integration and/or integer phase wrapping.

It is an advantage of embodiments of the present invention that an in-phase and quadrature (I/Q) modulated feedback path is used, which can offer an advantageously efficient calculation of an error signal to be used by the loop filter.

It is a further advantage of embodiments that the selectable filter parameters, e.g. multiplicative factors for pre-transforming values provided as input to a common filter block, may correspond to different powers of two, e.g. such that such selectable multiplication factor can be implemented very efficiently, e.g. by binary bit shifts. This may provide an efficient solution in terms of valuable processing time (e.g. to minimize processing delays) as well as device economics, e.g. cheap to implement and requiring only a small area footprint of the implementing integrated circuit.

A device and a method in accordance with embodiments of the present invention achieves the above objective.

In a first aspect, the present invention relates to a position sensor device for measuring a position. The position sensor device comprises a plurality of position sensor elements adapted to (respectively) generate a plurality of analog sense signals, each sense signal being substantially a same sinusoid function shifted over a constant (yet different for each of the sense signals) offset phase, wherein an input phase of the sinusoid function is representative of the position to be measured. The position sensor device comprises a digitization circuit that is coupled on its input side to the sensor elements and that is adapted to provide a digital signal representative of the input angle based on the plurality of sense signals.

The position sensor device comprises a digital processing unit, e.g. for implementing a phase-locked loop filter. The digital processing unit comprises an error signal generator for receiving the digital signal, for receiving a feedback signal and for computing an error signal indicative of a phase difference between the digital signal and the feedback signal. The digital processing unit comprises a digital filter for filtering the error signal and to generate a first output indicative of the position to be determined. The digital processing unit comprises a feedback path for providing the feedback signal to the error signal generator, in which the feedback signal is based on the first output of the digital filter.

The digital processing unit comprises a filter selector to select a filter to be applied by the digital filter from a plurality of different filters, each having a different transfer function, e.g. a different bandwidth, wherein said selection is based on the error signal or an output of the digital filter.

The plurality of filters are implemented by a common filter circuit ('common' referring to shared amongst the different filters, e.g. not to being commonplace) of the digital filter, in which at least one input on which the common filter circuit operates is scaled differently for each of the different filters to obtain (i.e. to select) different filter bandwidths depending on the selected filter. Thus, the 'filter selector' may advantageously be implemented, in accordance with embodiments of the present invention, by a forward gain selection to the common filter block, e.g. which may comprise a first and second order integrator (e.g. a further integrator in series connection with the first integrator). Therefore, parameters and design specifications of this common filter block may be fixed (embodiments not being necessary limited thereto), while a 'filter selection' can still be effected by such forward gain selection to obtain different overall filter characteristics in accordance with the selection, e.g. different PLL characteristics with different LPF bandwidths. In other words, the 'filter selector' should not be interpreted in a narrow sense as a direct filter selector, even though embodiments do not necessarily exclude this either.

The device comprises an output for outputting an output signal indicative of the position to be measured based on the first output of the filter.

In a position sensor device in accordance with embodiments of the present invention, the plurality of different filters may be a discrete plurality of filters. For example, the filter selector may comprise switching components that are switchably connected to control the selected filter.

In a position sensor device in accordance with embodiments of the present invention, the filter selector may be adapted for determining a value indicative of a magnitude of acceleration based on the error signal or an output of the digital filter, for testing whether the value indicative of the magnitude of acceleration lies in any one of a plurality of ranges (e.g. non-overlapping ranges, e.g. forming a partition of an operating range from zero to a predetermined highest level), and selecting the filter from the plurality of filters based on in which range the value is determined to lie, in which the plurality of filters correspond to increasing bandwidths for increasingly higher ranges of the value.

In a position sensor device in accordance with embodiments of the present invention, the filter selector may be adapted for selecting the filter to be applied in a next step as the filter corresponding to the range in which the value is determined to lie if this range is higher than the range corresponding to the currently selected filter, and for selecting the filter to be applied in a next step as the next filter that has a smaller bandwidth than the currently selected filter, e.g. to decrease the bandwidth by a single step, if the range in which the value is determined to lie is lower than the range corresponding to the currently selected filter.

A position sensor device in accordance with embodiments of the present invention may comprise a delay compensation unit to compensate for a phase drift of the first output of the filter, such that the output of the device is generated based on a value obtained by adding a correction offset to the first output.

In a position sensor device in accordance with embodiments of the present invention, the digital filter may be adapted for providing a second output signal indicative of a rate of change of the first output, and the delay compensation unit may be adapted for calculating the correction offset by multiplying the second output of the filter by a delay coefficient.

In a position sensor device in accordance with embodiments of the present invention, the filter may be adapted to generate a third output indicative of an acceleration, and the delay compensation unit may be adapted for calculating the correction offset as a sum of at least DV times V and DV2 times A, in which DV2 is a predetermined constant.

A position sensor device in accordance with embodiments of the present invention may comprise a temperature sensor for providing a temperature signal, and the delay compensation unit may be adapted to receive the temperature signal and to determine the delay coefficient based on the temperature signal.

In a position sensor device in accordance with embodiments of the present invention, the common filter circuit may comprise a first digital integrator, wherein an input provided to the first digital integrator corresponds to one of a plurality of scaled versions of the error signal selected in accordance with the selected filter, i.e. wherein the input provided to the first digital integrator is one of said at least one inputs of the common filter circuit and corresponds to a scaled version of the error signal that is thus scaled differently for each of the plurality of filters.

In a position sensor device in accordance with embodiments of the present invention, the common filter circuit may comprise a second digital integrator and an adder for adding a second scaled version of the error signal selected in accordance with the selected filter and the output of the first digital integrator, wherein an output of the adder is coupled as input to the second digital integrator. Thus, one of the inputs of the adder may be another one of the at least one inputs of the common filter circuit corresponding to a scaled version of the error signal, scaled differently for each of the plurality of filters.

In a position sensor device in accordance with embodiments of the present invention, the plurality of sensors may comprise at least two sensors, e.g. at least three sensors, arranged to produce sense signals each being a different function of the input phase representative of the position to be measured.

A position sensor device in accordance with embodiments of the present invention may be an angular position sensor device, and the plurality of position sensor elements may be magnetic sensors for measuring, by measurements, along different projection directions, of an angle of a magnetic field, i.e. representing the input phase. The position sensor elements may comprise horizontal and/or vertical Hall elements, and/or giant magnetoresistance (GMR) sensor elements, and/or tunneling magnetoresistance (TMR) sensor elements and/or sensing coils coupled to electrical resolvers. For example, the sense signals may correspond to projections of the magnetic field B in different directions, e.g. along the directions corresponding to angles $k.2\pi/N$ (k=0, 1, ..., N-1).

A position sensor device in accordance with embodiments of the present invention may comprise a permanent magnet, e.g. a multi-pole magnet.

In a position sensor device in accordance with embodiments of the present invention, the digital value may comprise (or consist of) a sine (or quadrature) component and a cosine (or in-phase) component of the input phase.

In a position sensor device in accordance with embodiments of the present invention, the digitization circuit may comprise a digital transformation unit adapted for computing the digital signal from sampled values of the sense signals, wherein the digital transformation unit is adapted to apply a Clarke transformation or another suitable linear transformation to transform the N sense signals, related to each other in accordance with phase shifts of $2\pi/N$, to the sine component and the cosine component.

In a position sensor device in accordance with embodiments of the present invention, the feedback path may comprise a phase to I/Q value converter for converting the first output of the filter to a cosine and a sine component forming the feedback signal.

In a position sensor device in accordance with embodiments of the present invention, the error signal generator may comprise a linear combiner for multiplying the digital signal with the complex conjugate of the feedback signal, and a phase approximator to provide the error signal in the form of an approximation of the phase difference between the digital signal and the feedback signal based on an output of the linear combiner.

In embodiments of the present invention, a forward path of the loop filter may operate in the phase domain, while a feedback path of the loop may operate in the I/Q domain. This advantageously allows filtering in the phase domain, which can be considered to represent the position to be determined (or is directly functionally related to the position to be determined), while an efficient calculation of the error signal can be achieved in the I/Q domain.

In a position sensor device in accordance with embodiments of the present invention, the digitization circuit may comprise an analog to digital converter adapted for sequentially sampling each of the plurality of sense signals.

In a position sensor device in accordance with embodiments of the present invention, the digitization circuit may comprise an analog or digital interpolation unit adapted for interpolating the plurality of sense signals, sequentially sampled by the analog to digital converter, to a same sampling point in time.

In a position sensor device in accordance with embodiments of the present invention, the digitization circuit may comprise an electromagnetic compatibility filter, an amplifier, a signal de-chopper, a direct current offset compensation unit and/or other signal pre-processing components, as generally known in the art.

In a position sensor device in accordance with embodiments of the present invention, the digitization circuit may comprise an amplifier and an automatic gain control for adjusting a gain of the amplifier to maximize the use of the available analog-to-digital converter input range of the analog to digital converter and/or to prevent saturation thereof, wherein an output of the automatic gain control is furthermore used for normalization in the digital processing unit.

In a second aspect, the invention relates to a method for measuring a position, the method comprising:

obtaining a plurality of analog sense signals from a corresponding plurality of position sensor elements, wherein each sense signal is substantially (e.g. except for noise and/or a direct current component and/or electromagnetic interference and/or latency effects and/or other nuisance factors as known for such sensors) a same sinusoid function shifted over a different offset phase and wherein an input phase of the sinusoid function is representative of the position to be measured, generating a digital signal representative of the input phase based on the plurality of analog sense signals, digitally computing an error signal indicative of a phase difference between the digital signal and a feedback signal, filtering the error signal using a digital filter to generate a first output, digitally generating the feedback signal based on the first output, outputting a device output signal indicative of the position to be measured based on the first output of the digital processing unit, and selecting a filter to applied by the digital filter from a plurality of different filters, each having a different transfer function, based on the error signal or an output (the first output, the second output, the third output, or another output) of the digital filter.

For example, the steps of computing the error signal, filtering the error signal and generating the feedback signal may form a phase-locked loop. Filtering the error signal comprises scaling at least one input on which a common filter in the digital filter operates differently for each of the plurality of filters to obtain different filter bandwidths for each of the plurality of filters.

Figure 1:
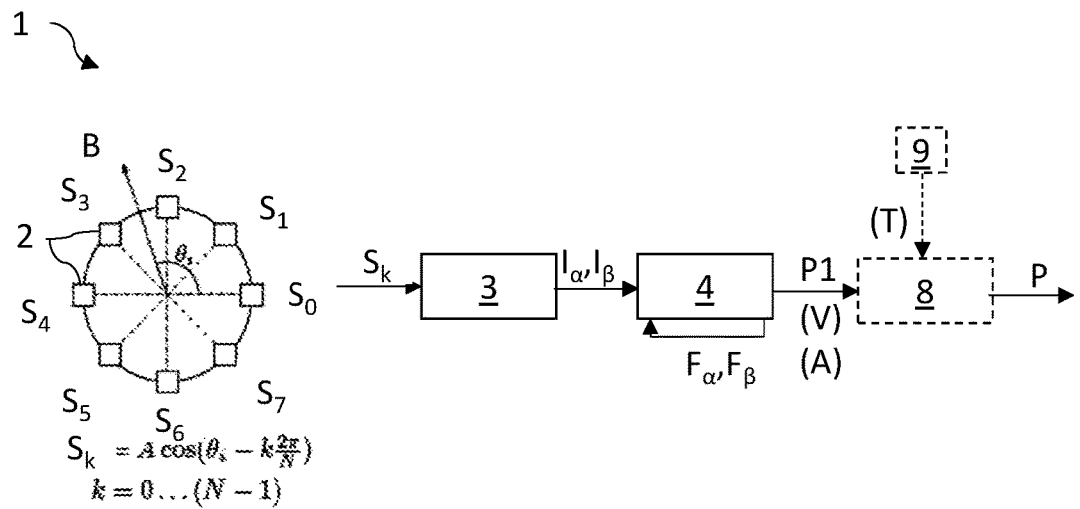
FIG. 1 shows a device in accordance with embodiments of the present invention.

The drawings are schematic and not limiting. Elements in the drawings are not necessarily represented on scale. The present invention is not necessarily limited to the specific embodiments of the present invention as shown in the drawings.

DETAILED DESCRIPTION

Notwithstanding the exemplary embodiments described hereinbelow, is the present invention only limited by the attached claims. The attached claims are hereby explicitly incorporated in this detailed description, in which each claim, and each combination of claims as allowed for by the dependency structure defined by the claims, forms a separate embodiment of the present invention.

The word "comprise," as used in the claims, is not limited to the features, elements or steps as described thereafter, and does not exclude additional features, elements or steps. This therefore specifies the presence of the mentioned features without excluding a further presence or addition of one or more features.

In this detailed description, various specific details are presented. Embodiments of the present invention can be carried out without these specific details. Furthermore, well-known features, elements and/or steps are not necessarily described in detail for the sake of clarity and conciseness of the present disclosure.

In a first aspect, the present invention relates to a position sensor device for measuring a position, e.g. to determine a rotation angle (or a linear or curvilinear displacement via a suitable mechanical coupling). The position sensor may be operated over a wide range of angular velocities, e.g. from substantially zero to 80000 rpm or even higher, for example even up to, or more than, 100000 rpm, for example 700000 rpm, potentially even higher, e.g. 1 Mrpm. For example, an ADC sampling rate of a digitizer part of the device in accordance with embodiments, e.g. to convert an analog signal into the digital domain for further processing as described in detail hereinbelow, may be in the range of 100 kHz (lower values not necessarily excluded) to 2 MHz (higher values not necessarily excluded), e.g. in the range of 400 kHz to 1 MHz, e.g. in the range of 500 kHz to 900 kHz, e.g. in the range of 700 kHz to 800 kHz, e.g. about 770 kHz.

Preferably, the position sensor can be capable of accurately determining the angular position regardless of the angular velocity and/or angular acceleration, e.g. with a measurement error of less than 5°, preferably less than 2°, or even better, e.g. less than 1°, e.g. less than 0.5°, or even lower, e.g. in the range of 0.1° to 0.4°. For example, the targeted precision may be about 0.3° for angular velocities below (e.g. up to) 250000 rpm, e.g. where slightly larger, but still performant, measurement deviations may be tolerated for even higher angular velocities.

FIG. 1 shows an exemplary position sensor device 1 in accordance with embodiments of the present invention.

The position sensor device comprises a plurality of position sensor elements 2 adapted to (respectively) generate a plurality of analog sense signals $S_k$, each sense signal being substantially a same sinusoid function shifted over a constant (yet different for each of the sense signals) offset phase, wherein an input phase (input angle) $\theta_i$ of the sinusoid function is representative of (i.e. associated with) the position to be measured. For example, the position to be measured may be a mechanical angle (without limitation) that is equal to, or linearly related to, the input phase. For example, the sense signals may have the form $A \cdot \cos(\theta_i - k \cdot 2\pi/N)$, wherein A is an amplitude, k is an index iterating over the N sensor elements (and thus over the N sense signals). However, the invention is not necessarily limited to fixed (constant) phase offsets of $2\pi/N$, even though a fixed and known phase relationship between the sense signals may typically exist. Likewise, the sensor elements may have different sensitivities, such that the amplitude is not necessarily equal for each of the signals. However, such differences in amplitude can be easily corrected by a gain control if necessary, as would be readily understood by the skilled person.

For example, the position sensor elements may comprise (or consist of) three inductive sensors, e.g. receiving coils, which may provide sense signals that are shifted by 120° phase shifts with respect to each other. However, embodiments may also relate to sense signals provided by different types of sensing elements, such as based on magnetic field strength or flux density measurements, e.g. Hall sensors. For example, any type of sensor elements that provide sinusoid or similar signals with predetermined phase shifts with respect to each other are contemplated. Also, the number of sensor elements, e.g. providing a corresponding plurality of sense signals, with a known relationship between the phase offsets may vary. For example, at least two sense signals may be provided with a known phase offset between the signals. Preferably, at least three sense signals may be provided to increase robustness. While aspects of embodiments are explained based on three sense signals, shifted by 120° phase shifts, it is to be noted that this number may be increased to further improve redundancy and/or reduce noise.

As will be further detailed hereinbelow, the position sensor device 1 operates on the sense signals in a tracking mode such as to accurately track the position (input angle). Such tracking loop keeps track of the input angle (without limitation, e.g. a suitable mechanical coupling may relate the input angle to a linear or curvilinear displacement) in an incremental way, e.g. by comparing an output estimate to an input derived from the analog sense signals.

As is well-known in the art, the position sensor device may be an angular position sensor device, in which the position deterministically determines a magnetic field (B) property, e.g. an orientation or strength of the field. For example, an external magnet (e.g. permanent magnet) may be fixed to a rotor part, while the position sensor elements may be fixed to a stator part, or vice versa. Alternatives as known in the art can also be envisioned, such as based on mutual inductance.

Thus, the sensor elements may be magnetic sensors. For example, the sensors may be arranged for measuring an angle of a magnetic field along different projection directions. For example, the plurality of sensors may comprise at least two sensors, e.g. at least three sensors, arranged to produce sense signals each being a different function of an input phase ($\theta_i$) representative of a position to be measured.

The device may also comprise a permanent magnet, e.g. a multi-pole magnet, in which the magnet is fixed to a rotor part and the sensors are fixed to a stator part (or vice versa), such that a relative angle between the rotor and the stator part can be determined by (and in operation of) the device.

For example, the position sensor device may be a magnetic angular sensor for measuring the angle of a magnetic field B, for example generated by a magnet. The position sensor elements 2 may comprise (or consist of) horizontal and/or vertical Hall elements, and/or giant magnetoresistance (GMR) sensor elements and/or tunnelling magnetoresistance (TMR) sensor elements. For example, the sense signals may correspond to projections of the magnetic field B in different directions, e.g. along the directions corresponding to angles $k \cdot 2\pi/N$.

Similarly, the position sensor elements 2 may comprise (or consist of) sensing coils, coupled to electrical resolvers, in which an angle-dependent mutual inductance between a driving coil and the respective sense coils is transduced.

The position sensor device comprises a digitization circuit 3 that is coupled on its input side to the sensor elements 2 and that is adapted to provide a digital signal representative of the input phase (input angle) $\theta_i$ based on the plurality of sense signals $S_k$, i.e. such that the input phase (e.g. over the range of a full period $2\pi$) can be uniquely determined from the digital signal, e.g. such that complete information about the input phase over its range of at least a full period is encoded in the digital signal. For example, the digital signal may consist of a digital value representative of the phase (e.g. an angle value) or of one or more scalar values from which the phase can be uniquely determined over its range of at least $2\pi$. The digital value may comprise (or consist of) a sine component and a cosine component, e.g. an I/Q representation of the input phase.

The term "digitization circuit" refers to the central function of this circuit to digitize the sense signals to produce a suitable digital value for further processing, but should not be interpreted narrowly as consisting of only an analog to digital converter (ADC). For example, the digitization circuit may comprise analog front-end components coupled between the sensor elements and an analog to digital converter (ADC) 24 of the digitization circuit and/or digital components for further transforming the output of the ADC to a suitable digital value.

Figure 2:
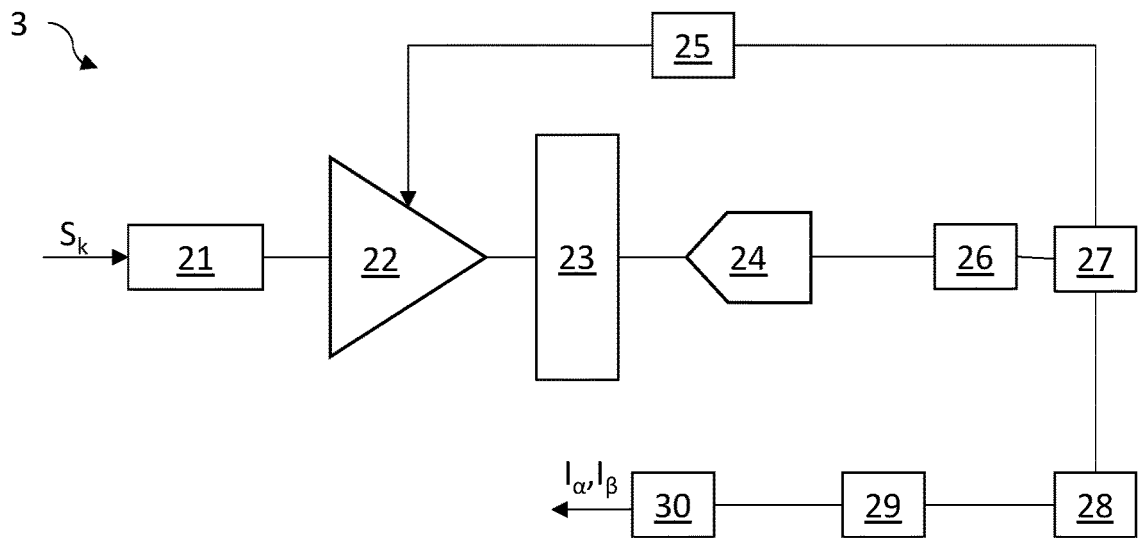
FIG. 2 shows an illustrative digitization circuit for use in a device in accordance with embodiments of the present invention.

Referring to FIG. 2, the digitization circuit 3 may, for example, comprise an electromagnetic compatibility filter (EMC) 21, an amplifier 22, an automatic gain control (AGC) 25, a signal de-chopper 26, a direct current (DC) offset compensation unit 27 and/or other signal conditioning components, as generally known in the art. For example, the digitization circuit may comprise a noise suppression filter, e.g. a FIR low-pass filter. For example, such noise suppression filter may apply a z-domain transfer function of $H(z) = \frac{1}{2}(1 + z^{-1})$, without embodiments being limited thereto. For example, a de-chopper 26 may compensate a DC offset by subtracting two subsequent samples of the signal.

Figure 3:
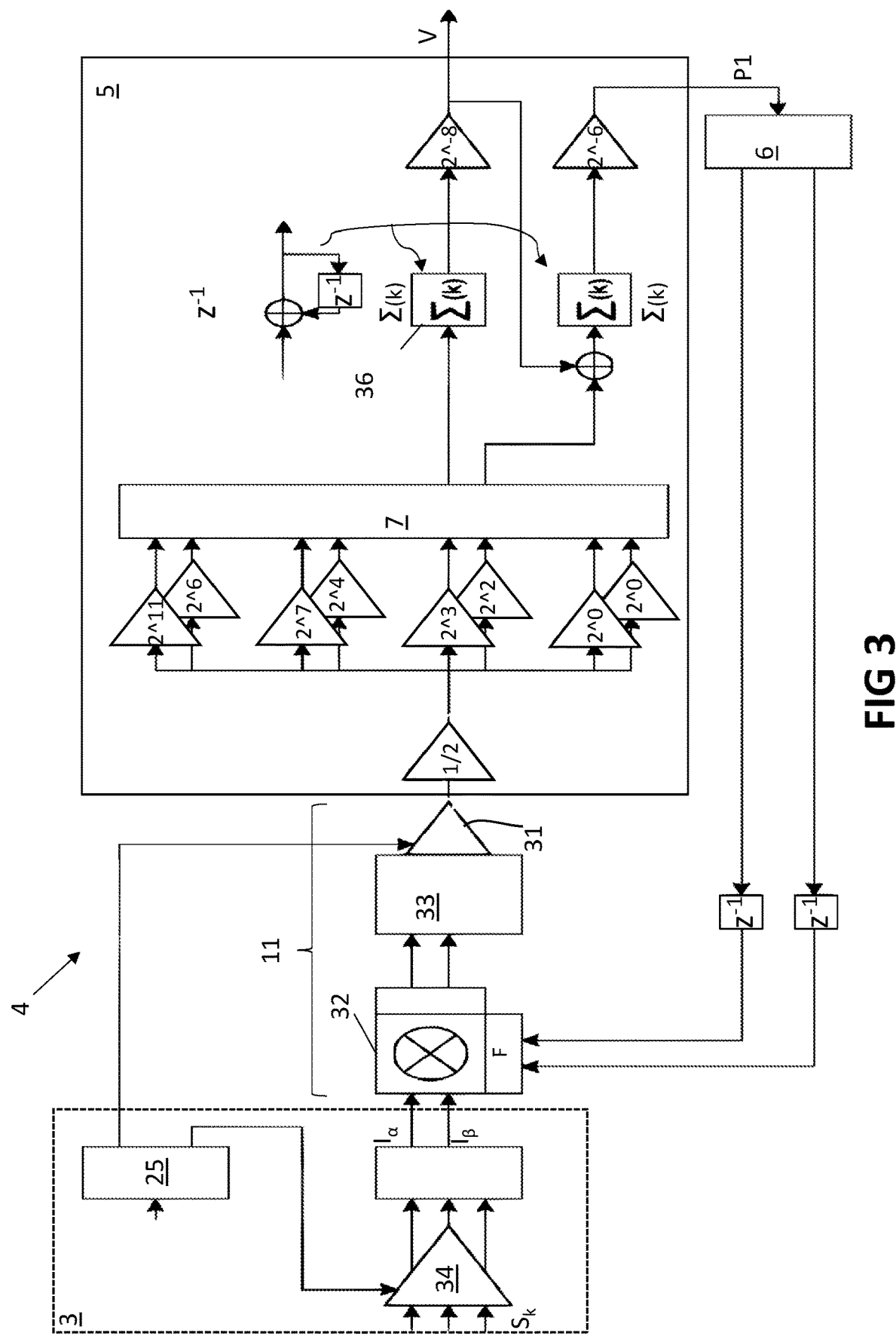
FIG. 3 shows a device in accordance with embodiments of the present invention.

An AGC 25 may advantageously stretch the dynamic range of the digital path by adapting the analog front-end gain (e.g. a gain of an amplifier) to maximize the use of the available ADC input range (preferably while preventing saturation), as dependent on the measured signal strength. For example, if the input signal strength (e.g. a maximum value of the plurality of sense signals) exceeds a predetermined threshold, the gain value may be decreased to avoid saturation, and if the input signal strength falls below a second predetermined threshold, the gain value may be increased, such that quantization noise is (relatively) reduced. Such AGC approaches (and without limitation to this specific example) are generally known in the art and therefore not discussed in detail. Furthermore, as shown in FIG. 3, the output of the AGC may additionally be used for power normalization in the digital processing unit 4. For example, an integer part of the gain may be used 34 in a preprocessing stage, e.g. before applying a Clarke transformation or other suitable transformation to combine the plurality of sense signals into the digital value produced by the digitization circuit, and a fractional part of the gain may be applied to normalize 31 a phase error signal in the digital processing unit 4. Thus, by using suitable normalization of the magnitude of a complex error signal, a phase error signal based on the complex error signal can easily obtained. This normalization can be based on the gain selected by AGC, e.g. directly or when transformed by a suitable transformation, e.g. as determined by a look-up table.

For example, the digitization circuit may comprise an analog to digital converter 24 to sample (each of) the plurality of sense signals. For example, the ADC may digitize two analog sense signals that are related to each other in accordance with a 90° phase shift, e.g. a first signal, A cos θ$_i$, and a second signal, A sin θ$_i$, jointly forming the digital value.

Referring again to FIG. 1, the digitization circuit 3 may comprise an analog to digital converter 24 to sample at least three sense signals and optionally a digital (preferably linear) transformation unit 30 to compute the digital signal from the sampled values of the plurality of sense signals, e.g. of at least three sense signals. Instead of a digital transformation unit 30, the digitization circuit may combine the at least three sense signals in the analog domain and digitize the result using an ADC (and possibly further components) to obtain the digital signal.

The digitization circuit 3 may comprise an analog or digital interpolation unit 28, such that the plurality of sense signals may be representative of the same sampling point in time, even though the analog sense signals are sampled sequentially by the ADC 24. The digitization circuit 3 may also comprise a sample-and-hold circuit 23, e.g. comprising a switching unit to feed the different sense signals sequentially to the ADC. Other components, as will be understood by the skilled person, may include a clock signal generator to drive the switching unit, the ADC, a demultiplexer 29 and possibly other elements in the sampling chain.

This advantageously allows the digitization unit to use a single ADC unit to sample all the sense signals, e.g. at a high sampling frequency. This may reduce the cost and/or power consumption, since only a single ADC is needed, and may avoid errors due to differences across different ADC units. Clearly, the digitization circuit may also comprise a demultiplexer 29 to split the acquired ADC output in a corresponding number of channels, if a single ADC is used to sample the plurality of sense signals. Suitable methods of interpolation to obtain synchronous time samples regardless of sequential sampling are considered to be well-known in the art. However, embodiments in which each sense signal is sampled, synchronously, by a dedicated ADC are not necessarily excluded.

In embodiments according to the present invention, the digital signal may comprise two value components, e.g. two digital values that are concomitantly available for processing. These two components may each represent the sinusoid function, e.g. may each be a phase-shifted version of the sinusoid function. A (constant) offset phase between the two digital signal components may be substantially equal to π/2 (90°). For example, the two digital signals may be considered as a cosine component and its corresponding sine component, or, equivalently, as an in-phase I and quadrature Q component, which together form (can be represented as) a single complex number scalar value.

A digital transformation unit 30 for computing the digital signal may receive three sense signals, which relate to each other in accordance with phase shifts of 2π/3 (120°), wherein the two digital signal components may relate to each other in accordance with a phase shift of π/2 (90°). In other words, the digital transformation unit may comprise a Clarke transformation unit to convert rotor phase information from a 3×120°-offset sinusoidal representation to a complex I and Q representation, e.g. using a linear transformation, known as the Clarke transformation or alpha-beta transformation:

$$\begin{bmatrix} I_\alpha \\ I_\beta \end{bmatrix} = \frac{2}{3} \begin{bmatrix} 1 & -\frac{1}{2} & -\frac{1}{2} \\ 0 & \frac{\sqrt{3}}{2} & -\frac{\sqrt{3}}{2} \end{bmatrix} \cdot \begin{bmatrix} I_U \\ I_V \\ I_W \end{bmatrix},$$

or a numerical approximation thereof; in which $I_U, I_V, I_W$ represent the three sense signals (possibly after suitable preprocessing, such as initial filtering, synchronous interpolation etc.), related to each other by phase offsets of 120°, and $I_\alpha, I_\beta$ correspond to the complex components forming the I/Q representation. It will be appreciated that a similar linear transformation can be obtained for combining more than three sense signals to robustly obtain a digital value $I_\alpha, I_\beta$. It will also be understood that such transformation may not be necessary in embodiments where only two sense signals, with a relative phase shift of 90°, are measured directly.

The position sensor device 1 comprises a digital processing unit 4 for processing the digital signal providing by the digitization circuit 3. The digital processing unit comprises (i.e. implements) a loop filter. An output of the loop filter is coupled to an output of the position sensor device to provide an output signal P indicative of the position to be measured. For example, the output may provide a digital value representative of the position, as filtered by the loop filter. Alternatively or additionally, the output may comprise a digital-to-analog converter to export the digital value as an analog signal. For example, the analog signal may comprise a sine wave signal and a cosine wave signal, the phase of which signals (except for the obvious 90° shift between the signals) is indicative of the position. The digital signal may thus be converted by two parallel DAC units to provide the sine and cosine analog signals. For example, the outputs of the DAC units may be provided as final device outputs via a sin/cos differential driver.

The digital processing unit 4 is adapted for receiving the digital signal, receiving a feedback signal and computing an error signal indicative of a phase difference between the digital signal and the feedback signal. For example, the digital processing unit 4 may comprise an error signal generator 11, e.g. a phase comparator, that is adapted to receive the digital signal, in operation of the device, to receive the (digital) feedback signal and to compute the error signal indicative of a phase difference between the digital signal and the feedback signal.

For example, the digital signal may comprise two components $I_\alpha, I_\beta$ forming a single complex number and the feedback signal may also comprise two components $F_\alpha, F_\beta$ forming a single complex number, i.e. an I/Q representation (see also hereinabove w.r.t. the digitization circuit 3). For example, both the digital signal and the feedback signal may form an I/Q representation. Thus, the error signal can be efficiently computed, using a linear combiner 32, by digitally multiplying the complex digital signal with the complex conjugate of the feedback signal (or equivalently vice versa, except for a trivial change of sign). For example, if the digital signal is represented by $I_\alpha + jI_\beta$ (j referring to the imaginary unit) and the feedback signal is represented by $F_\alpha + jF_\beta$, the error signal generator may compute the error signal as $E_\alpha + jE_\beta = (I_\alpha F_\alpha + I_\beta F_\beta) + j(F_\alpha I_\beta - I_\alpha F_\beta)$. While these complex multiplication and conjugation operations can be implemented very efficiently, the argument of the error signal thus obtained is advantageously equal to the difference in phase, e.g. as can be easily understood by changing to a polar representation of the operation.

Furthermore, the error signal generator 11 may comprise a phase approximator 33 to provide the error signal in the form of an approximation of the phase difference φ between the digital signal received as input and the feedback signal, based on the result of the output of the linear combiner. For example, the error signal φ can be computed by a $\tan(E_\beta/E_\alpha)$, or approximated, for example using a small angle approximation $\varphi \approx \sin(\varphi) \approx \tan(\varphi)$, for example by $\varphi \approx E_\beta/$ ∥E∥, φ~=$E_β/E_α$ or φ~=K. $E_β$, where K is a suitable ratio to be determined dynamically or predetermined by using a suitable signal normalization.

The digital processing unit 4 comprises a digital filter 5 for filtering the error signal, e.g. the phase difference φ, and to generate a first output P1 indicative of the position to be determined. The digital processing unit 4 comprises a feedback path 6 (e.g. comprising a feedback signal unit) for providing the feedback signal to the error signal generator 11, in which the feedback signal is based on the output of the digital filter.

In embodiments of the present invention, the forward path of the loop may operate in the phase domain, while a feedback path of the loop may operate in the I/Q domain. This advantageously allows filtering in the phase domain, which can be considered to represent the position to be determined (or is directly functionally related to the position to be determined), while an efficient calculation of the error signal can be achieved in the I/Q domain.

This output P1 of the filter 5, or a signal determined from this output, may be used to form the output signal P of the device 1. Thus, the loop filter implemented by the digital processing unit may be formed by the error signal generator 11, a forward path implemented by the digital filter 5 and the feedback path 6. In the example discussed hereinabove, the error signal generator 11 may receive the feedback signal as a complex I/Q representation, such that the feedback path 6 may comprise a phase to I/Q value converter for converting the output indicative of the position to be determined, in the form of a phase value, to a complex I/Q value (e.g. a cosine and a sine of the phase).

In advantageous embodiments, the digital filter 5 may be adapted for providing a second output signal V indicative of a rate of change of the output indicative of the position, i.e. a second output signal indicative of a velocity.

The digital processing unit 4 comprises a filter selector 7 to select a filter to be applied by the digital filter 5 from a plurality of different filters, each having a different transfer function, e.g. a different bandwidth. For example, the plurality of different filters, from which a filter is selected by the filter selector, may be a discrete plurality of filters, such that an advantageously fast and simple filter selection can be achieved by simple inequality test operations and digital switching. Thus, the filter selector 7 may comprise switching components that are switchably connected to control the selected filter.

The different filters have substantially the same form, e.g. are implemented by a same signal processing path, but at least one input (e.g. two inputs, as discussed hereinbelow) of the filter can be scaled differently in accordance with the different filters. By scaling the input(s) to a common filter differently, a different bandwidth can be easily selected, and the device can be simply and efficiently designed.

For example, as shown in FIG. 3, the digital filter may comprise a double discrete integration, e.g. the "common" filter, wherein an input to the first digital integrator 36 corresponds to one of four (in this example, without limitation) scaled versions of the error signal. This scaling may be carried out, advantageously, by multiplication by different powers of two, e.g. bit shifts. Likewise, the second integrator 37 may operate on the sum (e.g. using an adder) of a second input and the output of first digital integrator, in which this second input corresponds to one of four (in this example, without limitation) scaled versions of the error signal (e.g. multiplications by different powers of two).

The digital filter circuit may comprise a first digital integrator arranged for receiving (a first scaled version of) the error signal and for outputting a version thereof accumulated over time, and a second digital integrator arranged for receiving the sum of (a second scaled version of) the error signal and the output of the first digital integrator.

Thus, in the example illustrated in FIG. 3, the filter selector 7 may select one of the four following transfer functions:

$$H_0(z) = \left(\frac{2^{0-8}}{1-z^{-1}} + 2^0\right) \cdot \frac{2^{-6-1}}{1-z^{-1}}$$

$$H_1(z) = \left(\frac{2^{3-8}}{1-z^{-1}} + 2^2\right) \cdot \frac{2^{-6-1}}{1-z^{-1}}$$

$$H_2(z) = \left(\frac{2^{7-8}}{1-z^{-1}} + 2^4\right) \cdot \frac{2^{-6-1}}{1-z^{-1}}$$

$$H_3(z) = \left(\frac{2^{11-8}}{1-z^{-1}} + 2^6\right) \cdot \frac{2^{-6-1}}{1-z^{-1}}$$

or, more generally, the digital filter may implement a filter of the form $$H(z) = \left(\frac{A1}{1-z^{-1}} + A2\right) \cdot \frac{1}{1-z^{-1}}$$

e.g. by using a double discrete integration circuit, in which the scaling factors $A_1$ and $A_2$ are selected by the filter selector 7 to apply one of the plurality of filters.

Figure 4:
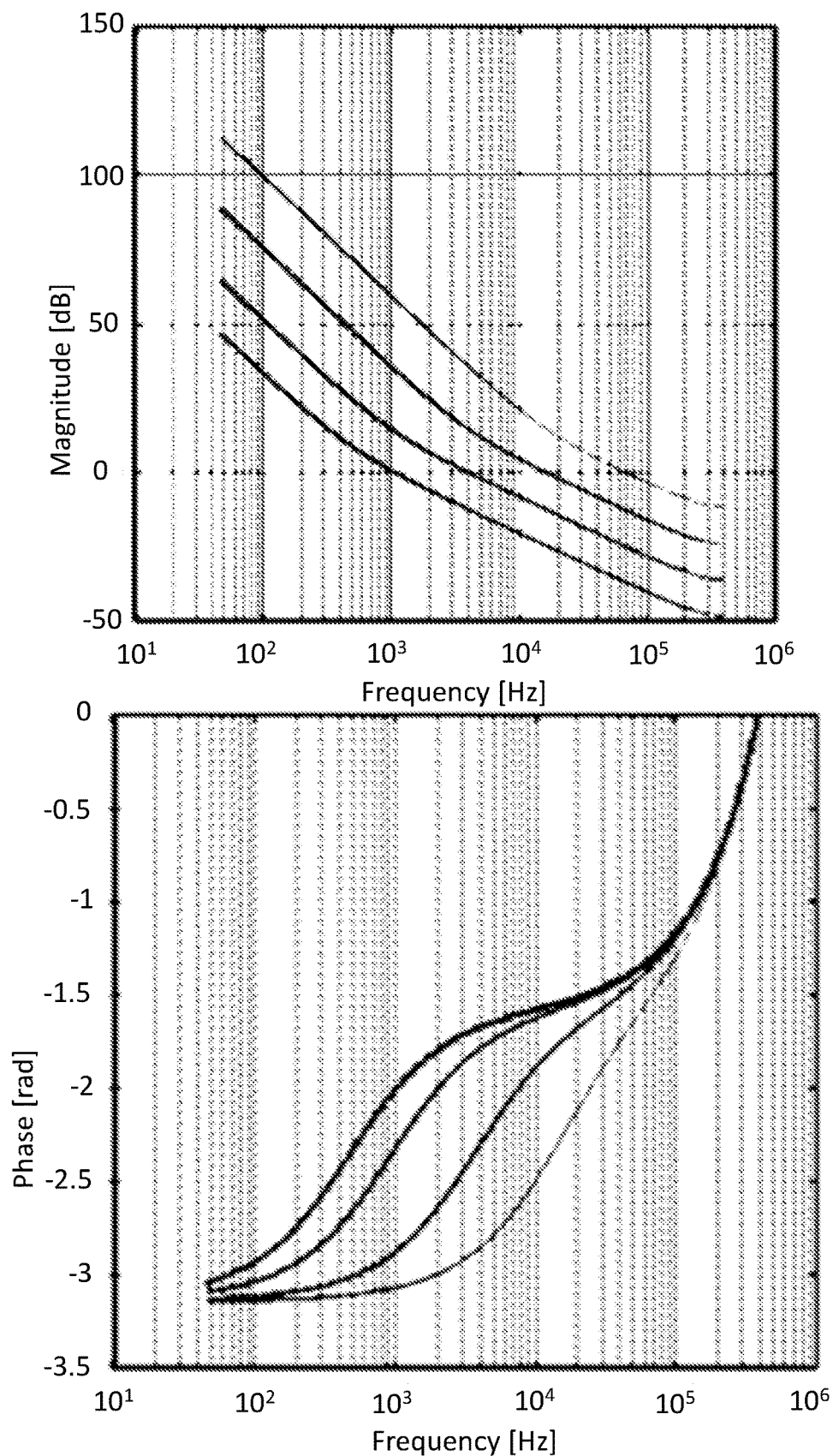
FIG. 4 illustrates open loop filter characteristics for an illustrative plurality of filters for use in accordance with embodiments of the present invention.
Figure 5:
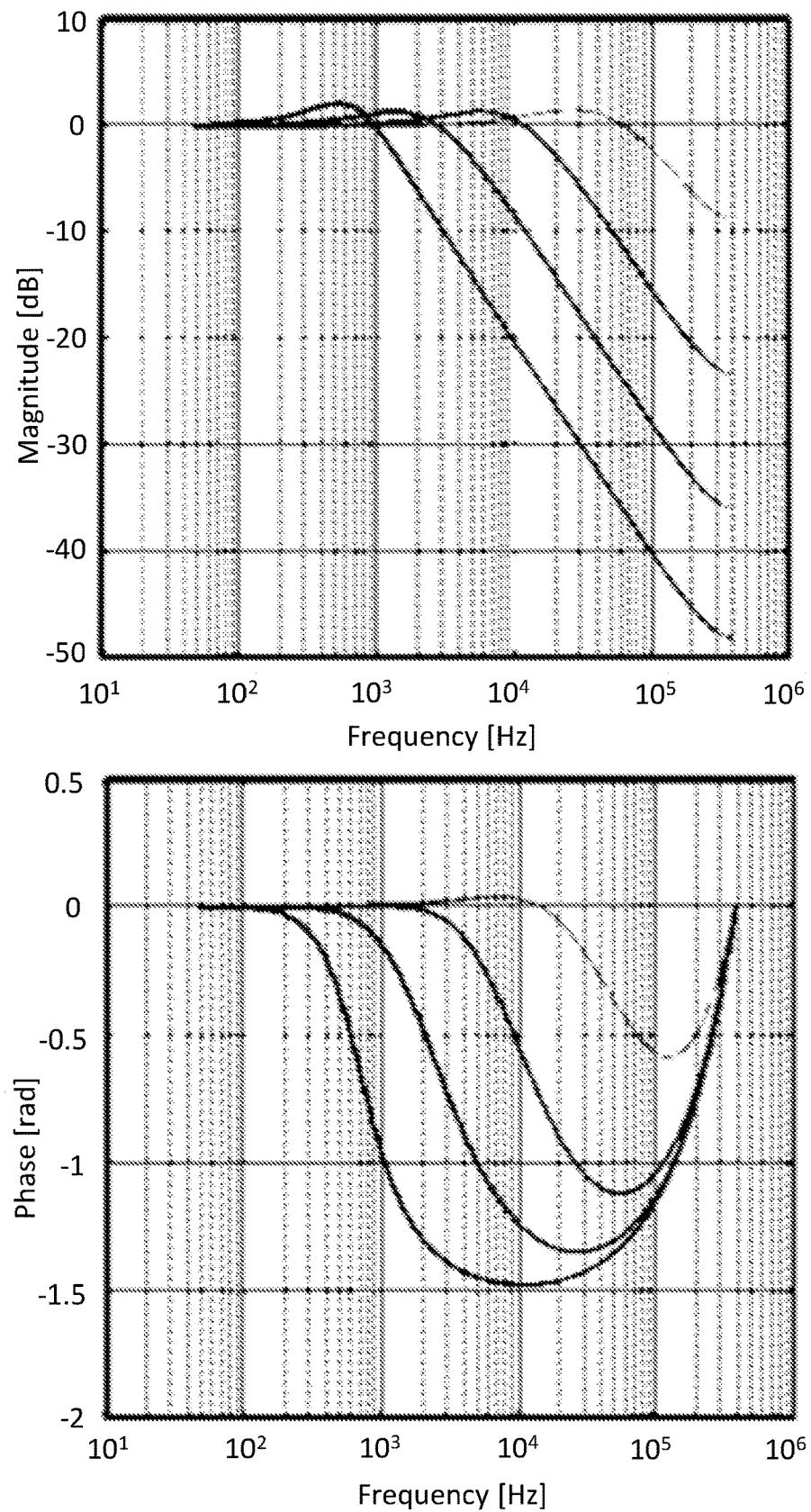
FIG. 5 illustrates closed loop filter characteristics for an illustrative plurality of filters for use in accordance with embodiments of the present invention.
Figure 6:
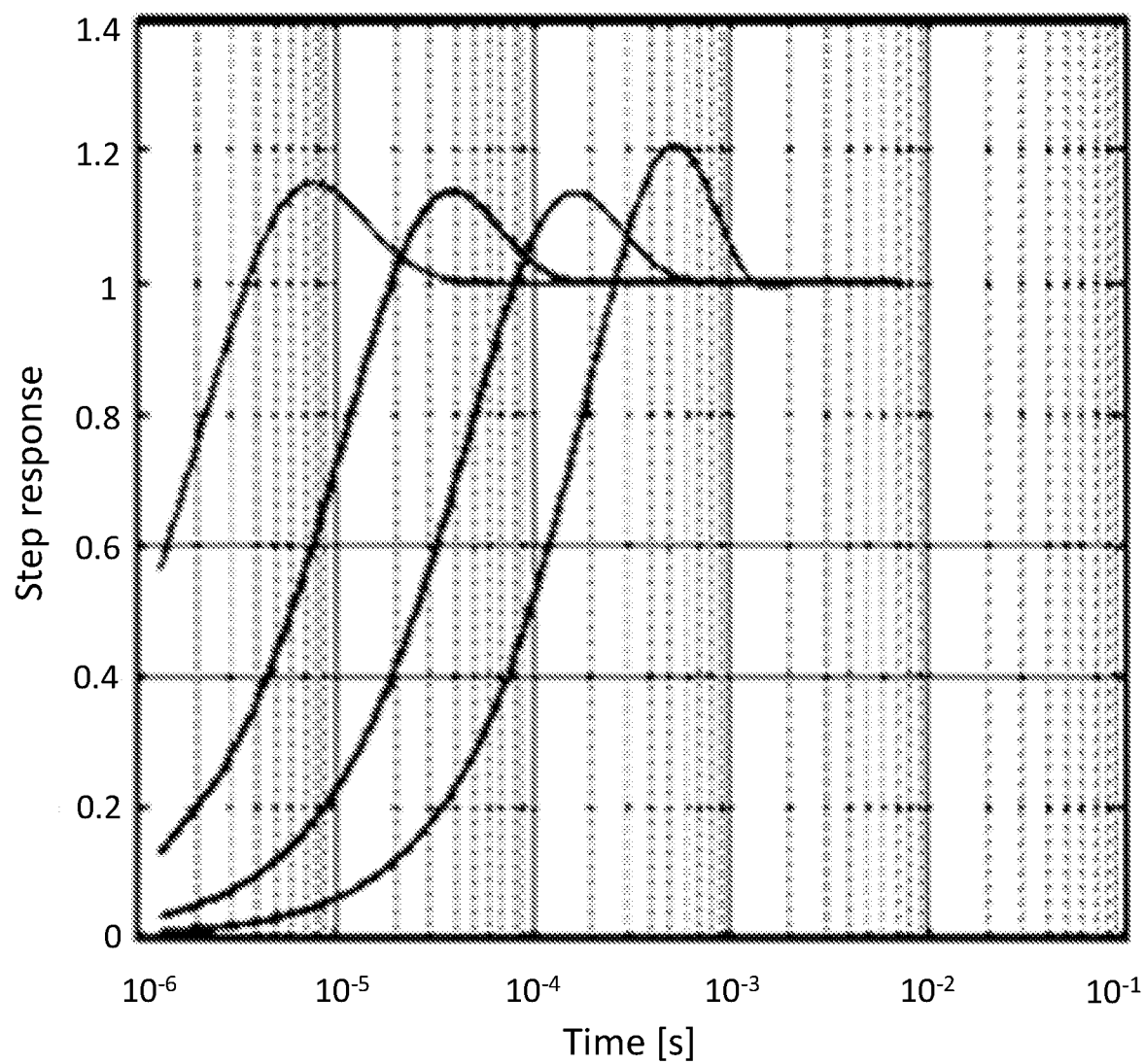
FIG. 6 illustrates a step response of an illustrative plurality of filters for use in accordance with embodiments of the present invention.

FIG. 4 illustrates the open loop characteristics (resp. magnitude and phase) of the phase locked loop (PLL) filter, for each of the four illustrative filters $H_1$ to $H_4$. FIG. 5 illustrates the corresponding closed loop characteristics, and FIG. 6 shows the step response of each filter.

Thus, by selecting an appropriate filter, an acceleration dependent estimate of the position (e.g. phase) can be provided to compensate phase errors during acceleration, e.g. due to latency of the phase-locked loop for speed estimation. While, in this example, a selection is made from four available filters, it shall be understood that a lower or higher number of filters may be used, e.g. considering a design trade-off between complexity and smoothness of the transitions when switching between filters.

The filter selector 7 selects the filter to be applied based on the error signal or on an output of the loop filter, e.g. an acceleration, a velocity or a phase signal output of the filter. For example, the filter selection that is currently applied may select a scaling of the error signal that is indicative of an acceleration, e.g. the 2^1, 2^3, 2^7 or 2^11 component illustrated in FIG. 3, while a second scaling of the phase signal may be representative of a velocity, i.e. the 2^0, 2^2, 2^4 or 2^6 component in FIG. 3. The selected proxy for acceleration may be used as basis for selecting the filter to be applied. Preferably, the selected filter may be controlled as a function of an acceleration signal. The filter may be selected by switching between different input proportionality elements, e.g. bit-shift elements, for providing inputs to a common filter circuit. The filter selector may comprise a finite state machine to select the filter.

The absolute value, or an obvious alternative, such as a squared value, of the signal used for selecting the filter may be tested whether it falls in each one of a plurality of ranges, and the selected filter may correspond to the range in which the signal has been determined to lie. For example, the (absolute value of the) signal may be quantized to a small number of bits, e.g. 1 bit, e.g. 2 bits, e.g. 3 bits, such that the range in which the signal lies can be easily determined.

Figure 7:
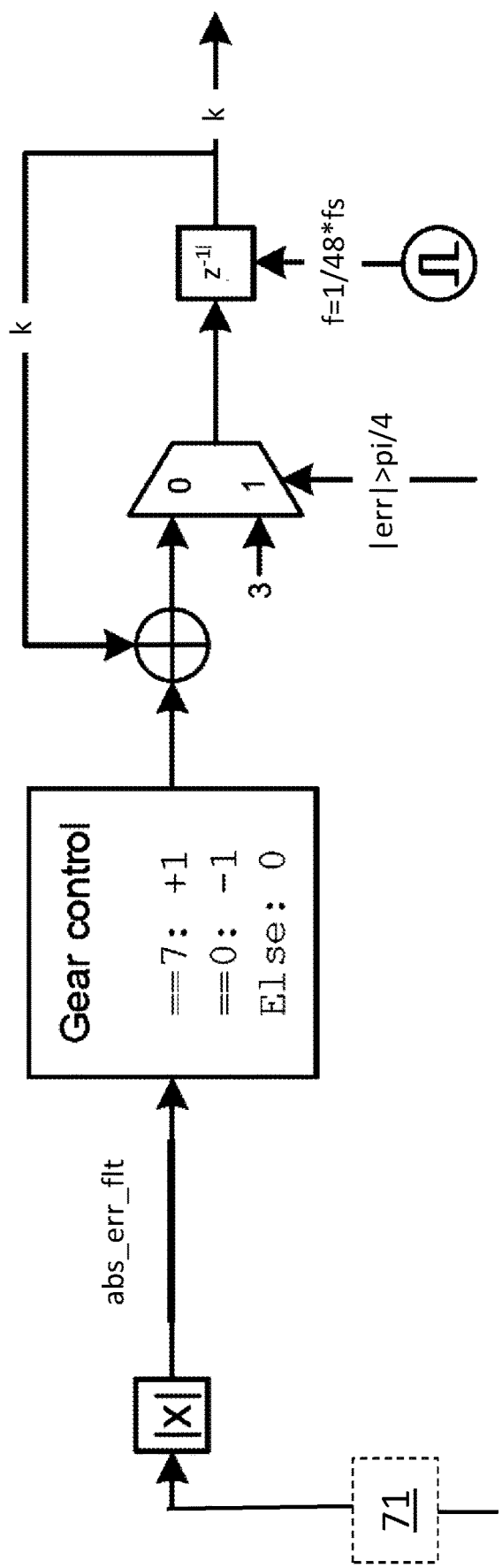
FIG. 7 shows an illustrative filter selector for use in a device in accordance with embodiments of the present invention.

Referring to FIG. 7, an illustrative approach for the filter selection is illustrated. In this example, one out of four possible filters is selected, corresponding to the example shown in FIG. 3, without limiting embodiments necessarily to this specific number or the structure of the filter illustrated in FIG. 3.

The filter selection may operate at a lower clock frequency than the loop filter, (in this example, 1/48 of the filter frequency) such that filter switching is less frequent, allowing the filter to settle after each switching operation before considering whether to switch to another filter. The filter selection is represented by a filter index k, e.g. a value k selectable from the possibilities 0,1,2,3 (in this example).

In embodiments, the selected filter may thus be selected by an index that is formed by a bit-quantized version if the absolute value (or equivalent) of the input signal (e.g. representative of acceleration), in which the lowest bandwidth filter corresponds to the lowest index (e.g. 0), and higher indices correspond to increasing bandwidths.

The input signal may be the phase error signal, e.g. the normalized phase error signal obtained from the normalizer 31, e.g. a normalized residual phase error value, even though other signals, such as an output of the loop filter, e.g. indicative of an instantaneous acceleration, could also be contemplated as input. The input signal may be filtered by a further filter 71. By applying a suitable further filter, e.g. a low pass filter, different filters (to be selected by the filter selector) can be selected on the basis of the filtered signal (provided by the further filter), e.g. gradual stepwise changes, e.g. by stepwise increment or decrement (of a filter selection index). The further filter 71 may reduce or avoid frequent switching of the filter in response to a noisy input. For example, the further filter may provide the effect of a sliding average or accumulation of the input to increase robustness against noise. However, the filter selector may also, alternatively or additionally, respond to a sudden and large input signal (e.g. residual phase error) by immediately switching to the filter with largest bandwidth, e.g. when the input signal exceeds (for example) pi/4. It shall be clear to the skilled person that the further filter 71 may be optional, e.g. when only selector responses to substantially large input signals are taken into account (thus already reducing undesirable frequent switching due to noise).

As an example, the further filter may be a low pass filter, e.g. having a transfer function $H(z)=2^{-6-4}/(1-(1-2^{-6})z^{-1}$. However, this is obviously only illustrative, as a suitable transfer function can be determined by the skilled person by relying on routine design considerations and/or straightforward experimentation or simulation. For example, the transfer may be tuned to a sampling and/or control logic period of the selector 7.

As already mentioned, the filtered signal (if filtered at all), provided by the further filter, may be converted to an unsigned (i.e. absolute) value |x| for the purpose of filter selection. The filtered signal, e.g. the absolute filtered signal, may also be saturated and/or rounded, such that decision thresholds can be, advantageously, easily determined from the quantizer range limits and do not depend on the sign of the value (even though an asymmetric selection that reacts differently depending on the sign is not necessarily excluded in embodiments either).

In embodiments, the selected filter may be selected by generating an index that is formed by a bit-quantized version of the absolute value (or equivalent). This proposed value of the index may be compared to the index of the filter that is presently applied (k, with the obvious delay $z^{-1}$ applied), and the index of the filter to be applied next may be determined by increasing and/or decreasing the previous index by one step depending on whether the proposed value is higher and/or lower than the previous value k.

For example, for an absolute value that exceeds a predetermined threshold, the value of k may be decreased by one unit step to ensure a slow and controlled reduction of the bandwidth during the phase settling process.

While a slow and controlled decrease of the bandwidth may generally be preferable, the bandwidth may be increased more rapidly to respond quickly to a discontinuity or very sudden acceleration.

Furthermore, to ensure that the filter is quickly switched to the highest bandwidth in case of a large deviation between the measured input signal and the phase output of the loop, if the error signal (or output of the filter) exceeds a threshold value, e.g. about pi/4 (without limitation to this example), a phase step may be detected, and the filter selector 7 may switch to the filter that has the highest bandwidth.

The position sensor device 1 may also comprise a delay compensation unit 8 to compensate for a phase drift (delay) of the first output P1 of the filter, e.g. generating the output P of the device by adjusting the output P1 of the loop filter to compensate for a delay.

For example, an advantageous correction to compensate for a processing delay may be implemented. This correction may be achieved by rotating the estimated angle (e.g. the first output of the filter) backward, e.g. by subtracting a phase drift angle. This phase angle may typically be speed dependent.

For example, at high rotational speeds, the processing delay may be advantageously compensated to obtain a (substantially) real-time signal indicative of an instantaneous position, or good approximation thereof. This corrected value may be provided as an output of the device, e.g. as a digital or analog signal, e.g. converting the digital value back to the analog domain, e.g. an analog sine and corresponding cosine wave signal. However, this corrected value may also, advantageously, be used to generate the feedback signal, e.g. via the phase to I/Q value converter.

For example, processing delays and/or other variable effects due to the angular velocity, the angular acceleration and/or temperature may cause a difference between the position output of the filter and the actual instantaneous position being measured, which can advantageously be corrected by applying a suitable phase drift offset. A predicted phase drift (e.g. a discrepancy between the actual input angle and an output angular signal) that occurs during the period of the delay may thus be used to correct the output, e.g. by a constant processing delay, an estimated angular speed and/or velocity, and/or a temperature into account.

The delay compensation unit 8 may be adapted to add a phase offset to the phase output of the filter, e.g. in accordance with $P=P1+\Delta P$. The delay compensation unit 8 may be adapted to calculate the phase offset $\Delta P$ by multiplying the second output of the filter V, e.g. indicative of an angular velocity, with a delay coefficient DV, e.g. $\Delta P=DV.V$.

Furthermore, the delay compensation may also take an acceleration dependent delay into account. For example, the filter may generate a third output A indicative of an acceleration, and may calculate the phase offset as $\Delta P=DV.V+DV2.A$, in which DV2 may be equal to one or another predetermined constant. The acceleration-dependent phase drift component DV2.A can thus compensate phase deviations due to the phase-locked loop delay (e.g. time to settle in response to sudden acceleration).

As will be understood by the skilled person, a predetermined constant may also be added to the phase offset, e.g. $\Delta P = DV \cdot V + DV2 \cdot A + OFS$, to calibrate the output to a desired reference position. For example, the device may be adapted to receive a configuration instruction to adjust the constant offset to a desired value, e.g. during a calibration procedure.

It is an advantage of embodiments of the present invention that a loop filter in the digital domain may be used that, without requiring additional processing or complexity, e.g. using (an) intermediate result(s) obtained in the filter loop, can be used to correct for a speed-dependent delay and/or a sudden acceleration, such that substantially a zero delay (or near-zero delay) estimate can be achieved. Particularly, if a double-integration loop filter is used (or a suitable obvious alternative thereto), the first and second order derivatives of the position signal can be readily made available for use in the delay compensation.

Since the delay may also be temperature dependent, e.g. due to magnetic latency, the device 1 may comprise a temperature sensor 9 to provide a temperature signal T. The delay compensation unit 8 may be adapted to receive the temperature signal T and to calculate the delay coefficient DV by taking the temperature into account. The delay compensation unit may comprise a lookup table of delay coefficient DV values for different temperatures, e.g. −40° C., 0° C., 40° C., 80° C., 120° C. and 160° C. (without limitation thereto). For example, the values stored in such lookup table may be determined in a calibration procedure. Furthermore, for intermediate values, the delay compensation unit may interpolate the stored values, e.g. to avoid discontinuities in the output due to switching between delay coefficient values. However, it shall be understood by the skilled person that this is merely an illustrative approach, and obvious alternatives can be contemplated. For example, instead of using a lookup table, the delay coefficient DV may be modelled as a parametric analytical function that is dependent on temperature, and suitable parameters of such function can be determined by a calibration procedure and stored accordingly for use.

Figure 8:
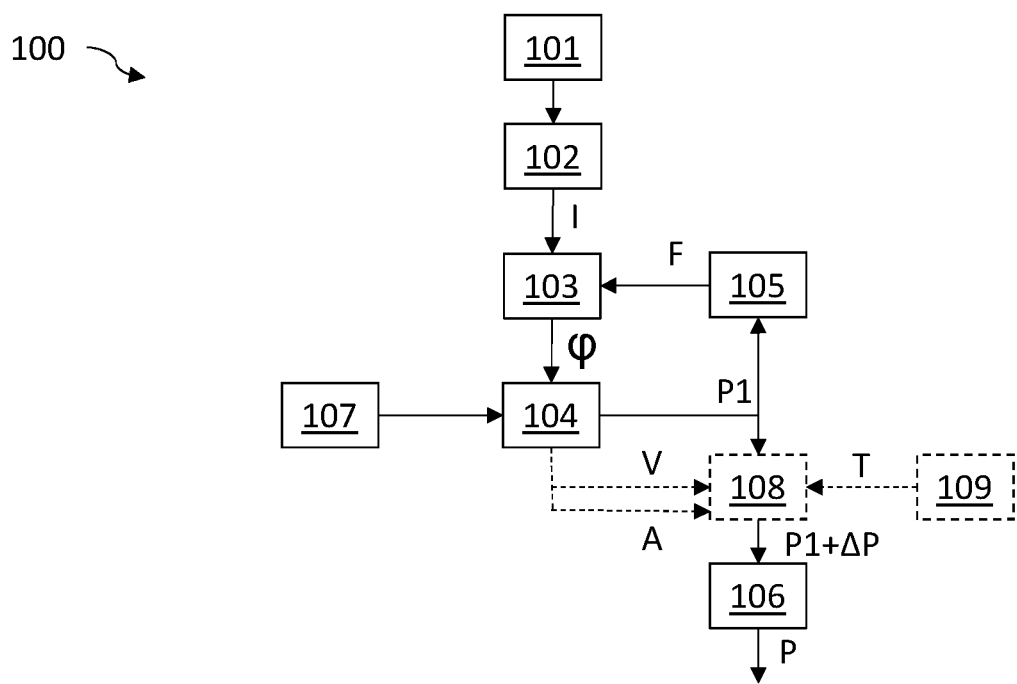
FIG. 8 schematically illustrates a method in accordance with embodiments of the present invention.

In a second aspect, the present invention relates to a method for measuring a position. An illustrative method 100 in accordance with embodiments of the present invention is shown in FIG. 8.

The method 100 comprises obtaining 101 a plurality of analog sense signals from a corresponding plurality of position sensor elements, in which each sense signal is substantially a same sinusoid function, e.g. $\sin(\theta_i + \Delta\theta_k)$, shifted over a different offset phase $\Delta\theta_k$ (e.g. a different and substantially constant offset phase for each of the position sensor elements k=0, 1, . . . , N−1) and in which an input phase $\theta_i$ of the sinusoid function is representative of the position to be measured.

The method 100 comprises generating 102 a digital signal I representative of the input phase $\theta_i$ based on the plurality of analog sense signals, e.g. using a digitization circuit.

Generating 102 the digital signal may comprise sampling the N sense signals (e.g. using an ADC) and applying a Clarke transformation or another suitable linear transformation to transform the sense signals, related to each other in accordance with phase shifts of $2\pi/N$, to a sine component and a corresponding cosine component.

The method 100 comprises digitally computing 103 an error signal φ indicative of a phase difference between the digital signal I and a feedback signal F, e.g. using a digital processing unit.

Computing 103 the error signal may comprise multiplying the digital signal (e.g. a complex number formed by the cosine and sine component as respectively the real and imaginary part, or vice versa) with the complex conjugate of the feedback signal.

Computing 103 the error signal may comprise computing the error signal as an approximation of the phase difference between the digital signal and the feedback signal based on the result of said complex multiplication.

The method 100 comprises filtering 104 the error signal using a digital filter generating a first output P1.

Filtering 104 the error signal may also comprise generating a second output signal V that is indicative of a rate of change of the first output P1.

Filtering 104 the error signal may also comprise generating a third output A indicative of an acceleration, i.e. a rate of change of the second output P2.

Filtering 104 the error signal comprises scaling at least one input on which a common filter (i.e. shared filter, e.g. a master filter, e.g. embodied in a single filter circuit) in the digital filter operates (i.e. the input is transformed by the filter, e.g. as opposed to for example an input acting as a parameter or control setting of the filter) differently for each of the selectable filters to obtain different filter bandwidths (using the common filter) depending on the selected filter.

The, or each at least one, input may correspond to a scaled version (multiplied by a proportionality constant, e.g. using a bit shift over n bits, wherein n is selected differently for the different filters) of the error signal.

Filtering 104 the error signal may comprise digitally integrating (e.g. using a delay element, and an adder which adds an input to a delayed version of its output) one of the at least one inputs that is scaled differently for each of the plurality of filters.

Filtering 104 the error signal may comprise digitally integrating the sum of (e.g. another) one of the at least one inputs that is scaled differently for each of the plurality of filters and the output of the first digital integration mentioned hereinabove. The output of this second digital integration may form the first output P1. The output of the first digital integration may form the second output V. The input of the first digital integration may form the third output A.

The method 100 comprises digitally generating 105 the feedback signal, used for the computing 103 the error signal φ, based on the first output P1 of the digital filter.

Generating 105 the feedback signal may comprise converting the first output P1 to a cosine and a sine component, which together form the feedback signal.

The steps of computing 103 the error signal, filtering 104 the error signal and generating 105 the feedback signal form a phase-locked loop (PLL), i.e. are repeated in a loop to filter the error signal in accordance with a phase-locked loop filter.

The method 100 comprises outputting 106 an output signal P indicative of the position to be measured based on the first output P1 of the digital processing unit.

The method 100 also comprises selecting 107 a filter to applied by the digital filter from a plurality of different filters, each having a different transfer function, based on the error signal or an output of the digital filter.

The plurality of different filters may be a discrete plurality of filters and selecting 107 the filter may comprise a controlling a plurality of switching components to control the selected filter.

Selecting 107 the filter may comprise determining a value indicative of a magnitude of acceleration based on the error signal and/or the output of the digital filter, testing whether the value indicative of the magnitude of acceleration lies in any one of a plurality of ranges, and selecting the filter from the plurality of filters based on in which range the value is determined to lie, in which the plurality of filters correspond to increasing filter bandwidths for increasingly higher ranges of the value. For example, the testing may comprise quantizing the magnitude a small number of bits, e.g. 1 bit, 2 bits or 3 bits (or equivalently, the magnitude calculation may be performed on such quantized version of the value representative of acceleration), and the ranges may correspond to the unique values allowed for by this quantization.

Selecting 107 the filter may comprise selecting the filter to be applied in a next step (of the PLL; without necessarily requiring that the selection is performed for each loop iteration; e.g. the filter selection may be performed at a lower frequency than the loop frequency) as the filter corresponding to the range in which the value is determined to lie if this range is higher than the range corresponding to the currently selected filter, and/or selecting the filter to be applied in a next step as the next filter that has a smaller bandwidth than the currently selected filter if the range in which the value is determined to lie is lower than the range corresponding to the currently selected filter.

The method 100 may also comprise compensating 108 for a phase drift (e.g. a processing delay and/or a delay due to latency in response of the position sensor elements and/or other electronic components) of the first output P1 of the digital filter, e.g. such that the output P of the device is generated based on a value obtained by adding a correction offset ΔP to the first output P1.

Compensating 108 for the phase drift may comprise calculating the correction offset ΔP by multiplying the second output V of the filter by a delay coefficient DV.

Compensating 108 for the phase drift may comprise calculating the correction offset ΔP as a sum of at least DV times V and DV2 times A, in which DV2 is a predetermined constant. For example, the correction offset may be calculated by ΔP=DV.V+DV2.A or ΔP=DV.V+DV2.A+OFS, in which OFS refers to a predetermined or configurable offset.

The method 100 may also comprise measuring 109 a temperature T, e.g. using a temperature sensor. Compensating 108 for the phase drift may comprise determining the delay coefficient DV based on the measured temperature T.

Other features, or details of the features described hereinabove, of a method in accordance with embodiments of the present invention shall be clear in view of the description provided hereinabove relating to a device in accordance with embodiments of the present invention, and/or vice versa.

The invention claimed is:

1. A position sensor device for measuring a position of a mechanical element, the position sensor device comprising:
  a plurality of position sensor elements adapted to generate a plurality of analog sense signals, each analog sense signal being a sinusoid function shifted over a different offset phase and having a same frequency, wherein an input phase of the sinusoid function is representative of the position to be measured,
  a digitization circuit that is coupled to the sensor elements and that is adapted to provide a digital signal representative of the input phase based on the plurality of analog sense signals, and
  a digital processing unit for outputting a device output signal indicative of the position to be measured based on a first output of the digital processing unit,
  wherein said digital processing unit comprises:
  an error signal generator for receiving the digital signal and a feedback signal and for computing an error signal indicative of a phase difference between the digital signal and the feedback signal,
  a digital filter comprising a common filter circuit for filtering the error signal to generate the first output,
  a feedback path for providing the feedback signal to the error signal generator, in which the feedback signal is based on the first output of the digital filter, and
  a filter selector to select a filter to be applied by the digital filter from a plurality of different filters, each having a different transfer function, wherein said selection is based on the error signal or an output of the digital filter,
  wherein said plurality of filters are implemented by the common filter circuit of the digital filter, and
  wherein the error signal or a signal derived therefrom on which the common filter circuit operates is scaled differently for each of the different filters to obtain different filter bandwidths depending on the selected filter.

2. The position sensor device of claim 1, wherein said filter selector is adapted for selecting said filter from said plurality of different filters, wherein said plurality of different filters is a discrete plurality of filters.

3. The position sensor device of claim 1, wherein the filter selector is adapted for determining a value indicative of a magnitude of acceleration based on the error signal and/or the output of the digital filter, for testing whether the value indicative of the magnitude of acceleration lies in any one of a plurality of ranges, and for selecting the filter from the plurality of filters based on in which range the value is determined to lie, in which the plurality of filters correspond to increasing filter bandwidths for increasingly higher ranges of the value.

4. The position sensor device of claim 3, wherein the filter selector is adapted for selecting the filter to be applied in a next step as the filter corresponding to the range in which the value is determined to lie if this range is higher than the range corresponding to the currently selected filter, and for selecting the filter to be applied in a next step as the next filter that has a smaller bandwidth than the currently selected filter if the range in which the value is determined to lie is lower than the range corresponding to the currently selected filter.

5. The position sensor device of claim 1, comprising a delay compensation unit to compensate for a phase drift of the first output of the filter, such that the output of the device is generated based on a value obtained by adding a correction offset to the first output.

6. The position sensor device of claim 5, wherein the digital filter is adapted for providing a second output signal indicative of a rate of change of the first output, and wherein the delay compensation unit is adapted for calculating the correction offset by multiplying the second output of the filter by a delay coefficient.

7. The position sensor device of claim 6, wherein the filter is adapted to generate a third output indicative of an acceleration, and wherein the delay compensation unit is be adapted for calculating the correction offset as a sum of at least DV times V and DV2 times A, in which DV2 is a predetermined constant.

8. The position sensor device of claim 6, comprising a temperature sensor for providing a temperature signal, wherein the delay compensation unit is adapted to receive the temperature signal and to determine the delay coefficient based on the temperature signal.

9. The position sensor device of claim 1, wherein the common filter circuit comprises a first digital integrator, and wherein an input provided to the first digital integrator is one of said at least one inputs of the common filter circuit and corresponds to a scaled version of the error signal that is scaled differently for the plurality of filters.

10. The position sensor device of claim 9, wherein the common filter circuit comprises a second digital integrator and an adder for adding a second scaled version of the error signal, being a further one of said at least one inputs of the common filter circuit that is selected in accordance with the selected filter, and the output of the first digital integrator, wherein an output of the adder is coupled as input to the second digital integrator.

11. The position sensor device of claim 1, wherein the position sensor device is an angular position sensor device, and the plurality of position sensor elements are magnetic sensors for measuring, along different projection directions, an angle of a magnetic field representing the input phase, said magnetic sensors comprising horizontal and/or vertical Hall elements, and/or giant magnetoresistance sensor elements, and/or tunneling magnetoresistance sensor elements, and/or sensing coils coupled to electrical resolvers.

12. The position sensor device of claim 1, wherein the digitization circuit comprises a digital transformation unit for computing the digital signal from sampled values of the sense signals, wherein the digital transformation unit applies a Clarke transformation or another suitable linear transformation to transform the N sense signals, related to each other in accordance with phase shifts of $2\pi/N$, to a sine component and a corresponding cosine component.

13. The position sensor device of claim 12, wherein said feedback path comprises a phase to I/Q value converter for converting the first output of the filter to a cosine and a sine component forming the feedback signal.

14. The position sensor device of claim 13, wherein the error signal generator comprises a linear combiner for multiplying the digital signal with the complex conjugate of the feedback signal, and a phase approximator to provide the error signal in the form of an approximation of the phase difference between the digital signal and the feedback signal based on an output of the linear combiner.

15. A method for measuring a position of a mechanical element, the method comprising:
    obtaining a plurality of analog sense signals from a corresponding plurality of position sensor elements,
    wherein each sense signal is a sinusoid function shifted over a different offset phase and having a same frequency, and wherein an input phase of the sinusoid function is representative of the position to be measured,
    generating a digital signal representative of the input phase based on the plurality of analog sense signals,
    digitally computing an error signal indicative of a phase difference between the digital signal and a feedback signal,
    filtering the error signal using a digital filter to generate a first output,
    digitally generating the feedback signal based on the first output,
    outputting a device output signal indicative of the position to be measured based on the first output of the digital processing unit, and
    selecting a filter to applied by the digital filter from a plurality of different filters, each having a different transfer function, based on the error signal or an output of the digital filter,
    wherein filtering the error signal comprises scaling the error signal or a signal derived therefrom on which a common filter operates differently for each of the plurality of filters to obtain different filter bandwidths for each of the plurality of filters.

* * * * *